United States Patent
Furukawa et al.

(10) Patent No.: US 7,504,314 B2
(45) Date of Patent: Mar. 17, 2009

(54) METHOD FOR FABRICATING OXYGEN-IMPLANTED SILICON ON INSULATION TYPE SEMICONDUCTOR AND SEMICONDUCTOR FORMED THEREFROM

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Larry A. Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 10/907,565

(22) Filed: Apr. 6, 2005

(65) Prior Publication Data
US 2006/0226480 A1 Oct. 12, 2006

(51) Int. Cl.
H01L 29/93 (2006.01)
H01L 21/76 (2006.01)
(52) U.S. Cl. ...................... 438/407; 257/506
(58) Field of Classification Search ............ 438/297, 438/456, 407, 423; 257/401, 506
See application file for complete search history.

(56) References Cited

U.S. PATENT DOCUMENTS 5,393,693 A * 2/1995 Ko et al. .................... 438/297
5,476,819 A * 12/1995 Warren ...................... 438/456
5,739,574 A * 4/1998 Nakamura ................. 257/401
6,174,784 B1 1/2001 Forbes
6,211,039 B1 4/2001 Noble
6,300,218 B1 10/2001 Cohen et al.
6,319,333 B1 11/2001 Noble
6,333,532 B1 12/2001 Davari et al.
6,593,205 B1 * 7/2003 Chen et al. ................ 438/423
2002/0001965 A1 1/2002 Forbes

FOREIGN PATENT DOCUMENTS

JP 63302515 A 12/1988
JP 200315726 11/2000

* cited by examiner

*Primary Examiner*—Evan Pert
*Assistant Examiner*—Monica D Harrison
(74) *Attorney, Agent, or Firm*—Richard M. Kotulak; Greenblum & Bernstein P.L.C.

(57) ABSTRACT

The invention relates generally to a method for fabricating oxygen-implanted semiconductors, and more particularly to a method for fabricating oxygen-implanted silicon-on-insulation ("SOI") type semiconductors by cutting-up regions into device-sized pieces prior to the SOI-oxidation process. The process sequence to make SOI is modified so that the implant dose may be reduced and relatively long and high temperature annealing process steps may be shortened or eliminated. This simplification may be achieved if, after oxygen implant, the wafer structure is sent to pad formation, and masking and etching. After the etching, annealing or oxidation process steps may be performed to create the SOI wafer.

13 Claims, 6 Drawing Sheets

METHOD FOR FABRICATING OXYGEN-IMPLANTED SILICON ON INSULATION TYPE SEMICONDUCTOR AND SEMICONDUCTOR FORMED THEREFROM

FIELD OF THE INVENTION

The invention relates generally to a method for fabricating oxygen-implanted semiconductors, and more particularly to a method for fabricating oxygen-implanted silicon-on-insulation ("SOI") type semiconductors by etching regions into device-sized pieces prior to the SOI-oxidation process.

BACKGROUND OF THE INVENTION

For traditional oxygen-implanted SOI, it may be desirable to make an SOI wafer and then build devices on the SOI. Current processes for making silicon-on-insulator substrate layers may involve using oxygen ion implant ("SiMOX"). SiMOX requires a high dose oxygen implant into a substrate, such as a silicon substrate, to build a sufficiently thick buried oxide ("BOX") layer. However, converting the whole wafer surface all at once to an SOI layer often requires diffusion of significant quantities of oxygen through the top silicon surface in order to make a sufficiently high quality buried oxide.

Such oxygen diffusion requires an annealing process (also referred to as an oxidation process), which often occurs for a relatively long time at a relative high temperature. The annealing process turns the implanted layer into a true silicon dioxide, returns the top of the silicon to a defect-free state, and diffuses additional oxygen atoms through the SOI layer into the BOX layer. Additional oxygen is often used in the annealing process to consume small silicon particles left behind during the BOX layer formation. As this through-diffusion of oxygen competes unfavorably with oxidation of the top silicon surface (and the SOI-BOX interface), the process is often inefficient, and may require very long processing times at very high temperatures. Further, the top-surface oxidation may consume large portions of silicon available for the SOI layer.

After fabrication of these SOI substrates, processing generally continues employing conventional semiconductor integrated circuit fabrication techniques. An example of such processing includes forming a pad oxide and/or a pad nitride on the SOI. A mask is then applied to the pad oxide and/or pad nitride layers and the structure is etched. The mask is removed, and the resulting structure is annealed or oxidized to cure the portion of the SOI layer exposed by the etching. Additional processes, such as isolating SOI structures by filling spaces between devices with an electrically isolating material, such as silicon dioxide, may also occur.

The high cost of fabricating SOI SiMOX wafers is often a major cost hurdle for advanced semiconductor manufacturing. Current SOI manufacturing for silicon integrated circuits programs often has to pass along the higher costs to customers (e.g., keeping bulk silicon technology for everyday applications), or use substrates produced using bonding techniques. Bonding, however, also may be expensive. If high performance SOI is to become mainstream, cost reductions may be important.

SUMMARY OF THE INVENTION

An exemplary aspect of the invention provides a method for forming a semiconductor structure according to principles of the invention. The method may include the steps of implanting oxygen into a substrate to form a first layer and a second layer in the substrate. The method may further include removing at least one portion of the first layer of the substrate and oxidizing the resulting substrate.

A further exemplary aspect of the invention provides a method for forming a semiconductor structure according to a principle of the invention, where the method may include implanting oxygen into a substrate to form a first layer and a buried oxide layer in the substrate. The method may further include removing at least one portion of the first layer of the substrate, and oxidizing the resulting substrate to increase the thickness of the buried oxide layer.

A further exemplary aspect of the invention provides a semiconductor structure according to a principle of the invention, where the structure may include a first layer and a second layer adjacent to the first layer. At least one portion of the second layer may be exposed through the first layer and exposes at least one side wall of the first layer. The structure further may be characterized in that the at least the side wall of the first layer and the second layer are oxidized substantially simultaneously.

BRIEF DESCRIPTION OF THE DRAWINGS

The above and other features and advantages of the invention will become more apparent to those of ordinary skill in the art by describing in detail exemplary embodiments thereof with reference to the attached drawings.

DETAILED DESCRIPTION OF EMBODIMENTS OF THE INVENTION

According to an embodiment of the invention, the process sequence to make SOI is modified so that an implant dose may be reduced, and relatively long and high temperature annealing process steps may be shortened or eliminated. This simplification may be achieved if, after oxygen implant and prior to BOX anneal, a wafer structure is sent to pad formation, and masking and etching.

Once the top silicon layer has been cut into pieces by the etching process, more-standard oxidation processes may be employed to complete BOX formation. This process may take advantage of a diffusion "short-circuit" through the BOX layer to grow a thicker BOX layer than would be achieved through the oxygen implant alone. Thus, it may no longer be necessary to defuse oxygen through the silicon. Rather, oxygen is defused through the oxide from the edge of the etched stacks. An exemplary embodiment according to principles of the invention will now be described below.

Figure 1:
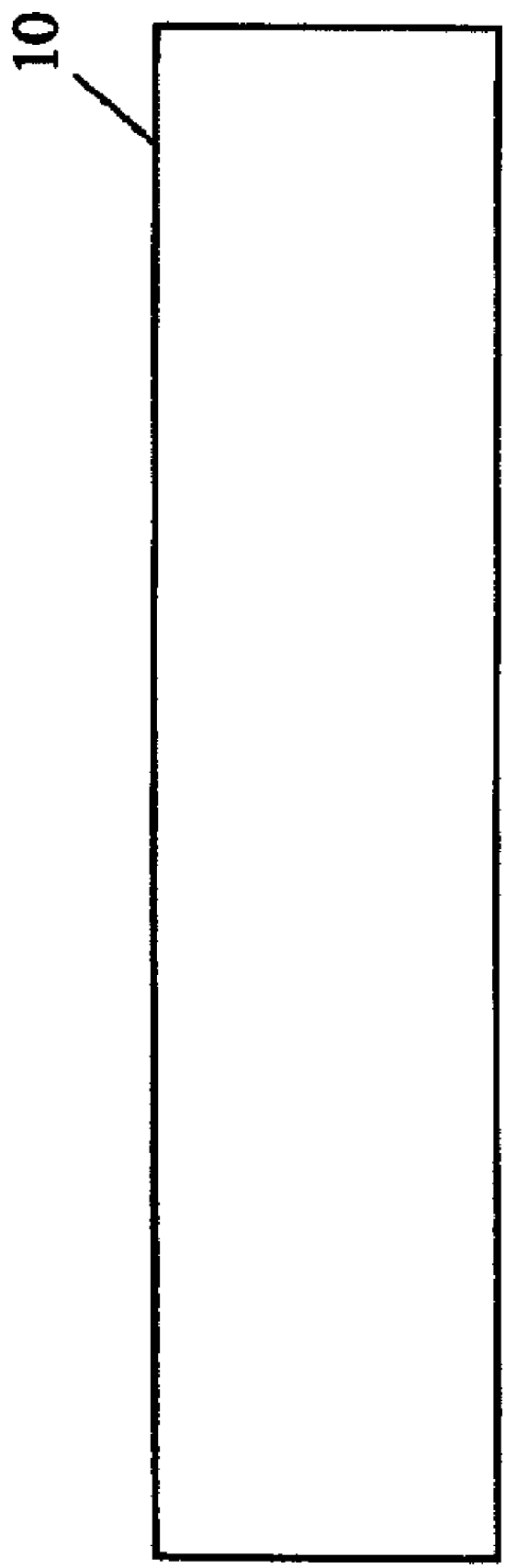
FIG. 1 is a cross-sectional view of a substrate layer according to principles of the invention.

FIG. 1 is a cross-sectional view of a substrate layer according to principles of the invention. The substrate wafer 10 is used at the start of the process. The substrate wafer 10 may be formed of a material, such as silicon, that permits implanting, or doping, by other materials.

Figure 2:
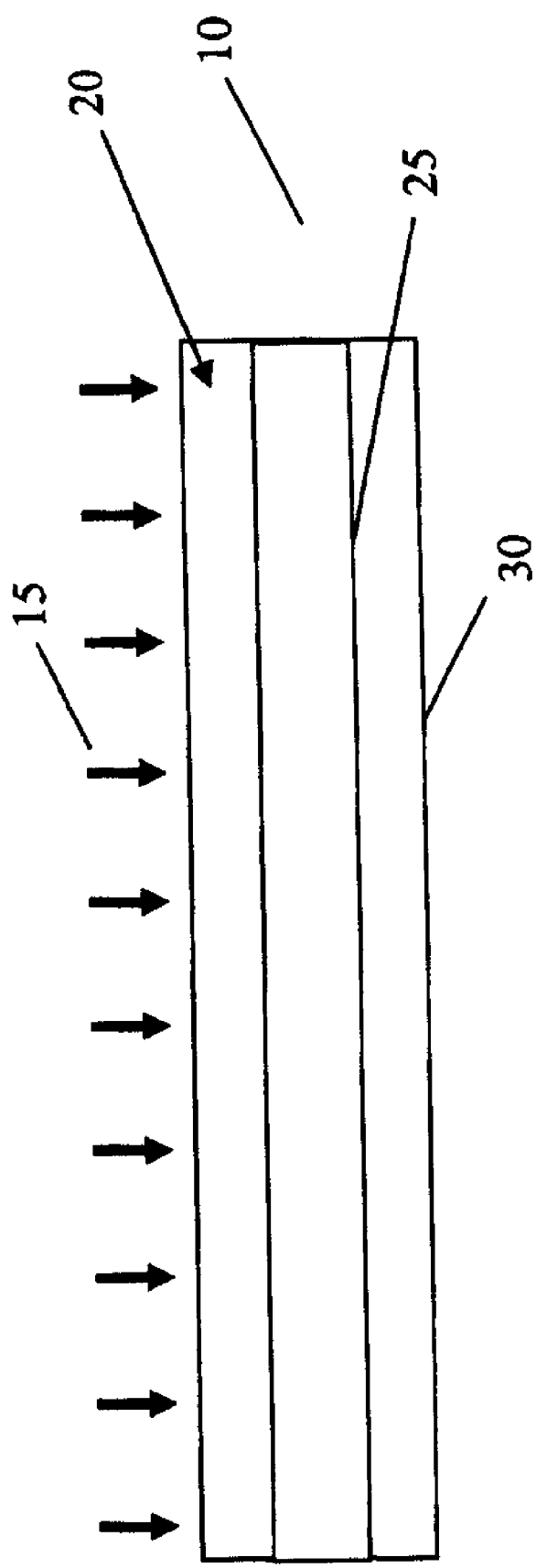
FIG. 2 is a cross-section view of an oxygen-implanted substrate layer according to principles of the invention.

FIG. 2 is a cross-section view of an oxygen-implanted substrate layer according to principles of the invention. The substrate wafer 10 is implanted with a dose of oxygen 15. By way of example, a silicon substrate wafer 10 is implanted with high dose of oxygen for forming a SiMOX layer. As described above, SiMOX may require a high dose oxygen implant into a substrate, such as a silicon substrate, to build a sufficiently-thick buried oxide ("BOX"). Implantation of the substrate wafer 10 results in a first silicon layer 20, an oxygen-implanted silicon layer 25 and a second silicon layer 30. The oxygen may be implanted using standard implanting processes known in the art.

Figure 3:
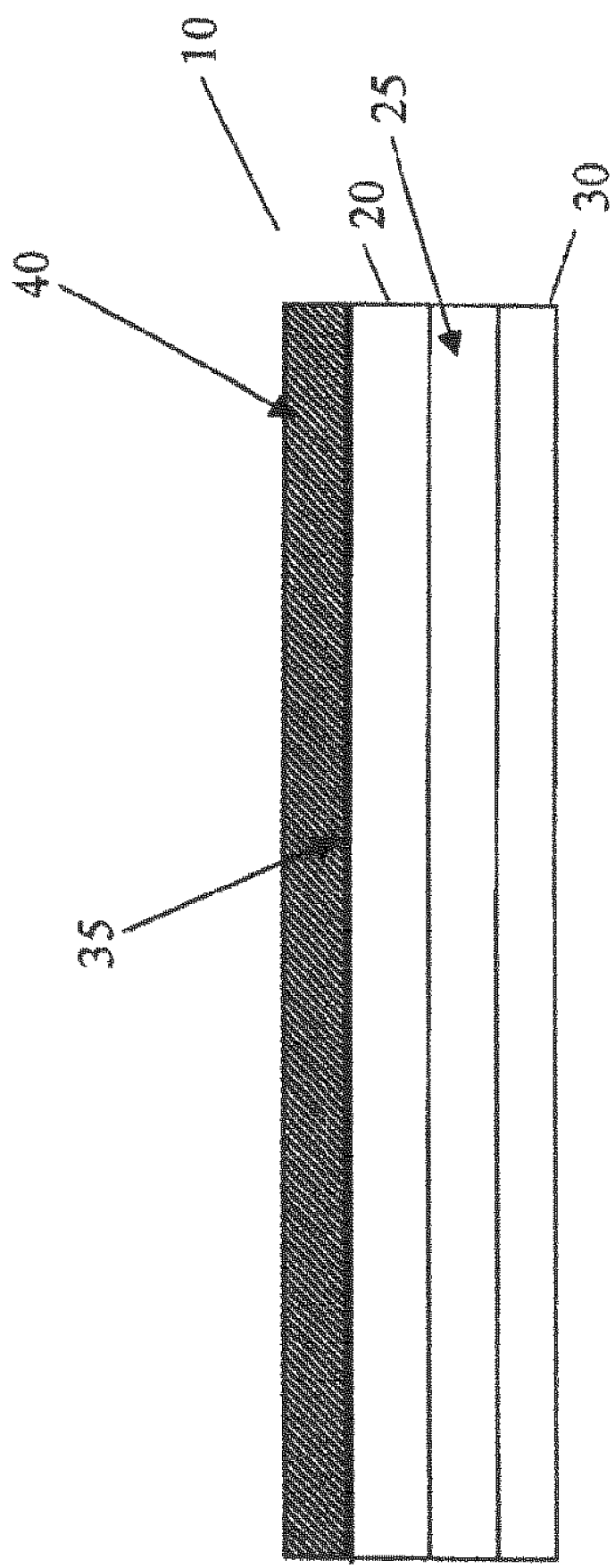
FIG. 3 is a cross-sectional view of pad materials formed on a substrate layer according to principles of the invention.

FIG. 3 is a cross-sectional view of pad materials formed on a substrate layer according to principles of the invention. Pad materials may include a pad oxide and a pad nitride on the silicon layer 20. As illustrated in FIG. 3, a pad oxide 35 is placed adjacent the first silicon layer 20. Further, a pad nitride layer 40 is placed adjacent the pad oxide layer 35. Pad materials may be applied using standard pad application processes known in the art.

Figure 4:
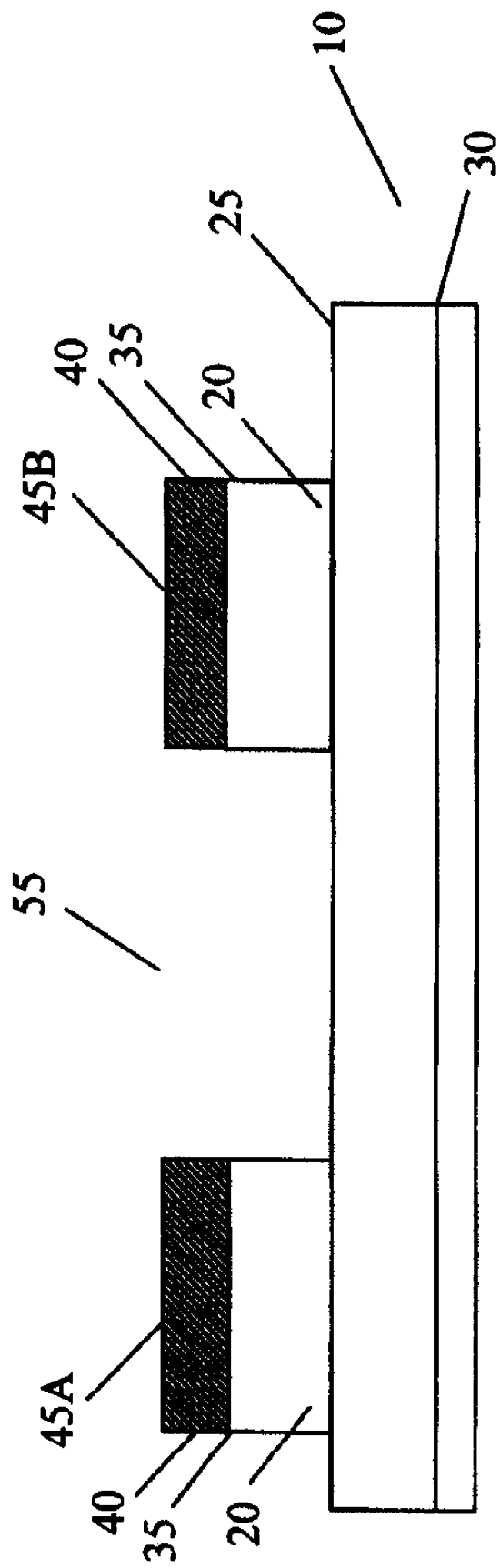
FIG. 4 is a cross-sectional view of an etched substrate layer according to principles of the invention.

FIG. 4 is a cross-sectional view of an etched substrate layer according to principles of the invention. A mask (not shown) is applied over the pad oxide layer and/or pad nitride layers. The mask may be applied using standard application processes known in the art. First silicon layer 20 of the substrate wafer 10 is etched, and the mask is removed. In the example illustrated in FIG. 4, two islands 45A and 45B are formed from the etching process. Each of islands 45A and 45B comprise a portion of the first silicon layer 20, a portion of the pad oxide layer 35 and a portion of the pad nitride layer 40. The etching may be any standard etching process known in the art.

Figure 5:
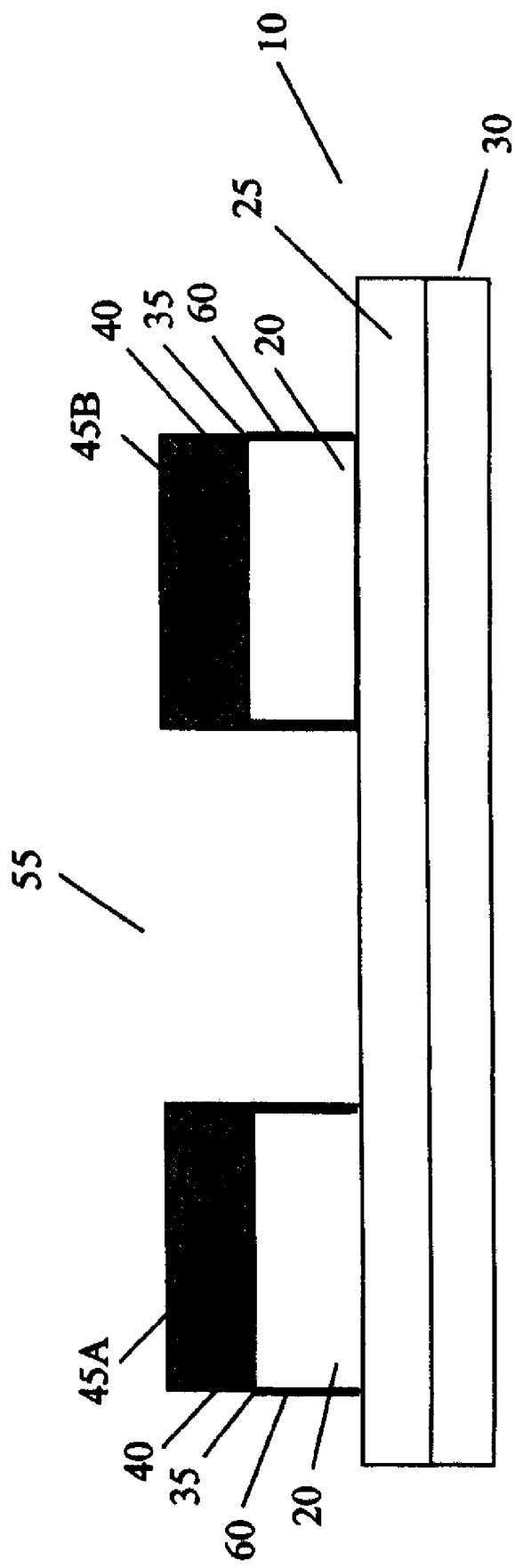
FIG. 5 is a cross-sectional view of an annealed substrate layer according to principles of the invention.

FIG. 5 is a cross-sectional view of an annealed substrate layer according to principles of the invention. The structure resulting from the etching is annealed or oxidized to cure the portions exposed by the etching. In the example illustrated in FIG. 5, the islands 45A and 45B have a shallow trench 55 located between them; shallow trench 55 is the result of the etching. Oxidized sidewalls 60 may also result from the annealing process.

As the top surface is protected by a pad layer, such as a pad nitride and/or a pad oxide layer, incipient SOI silicon is consumed during annealing only at the BOX/SOI interface and on sidewalls 60. Unwanted top-surface oxide may be reduced or eliminated, thereby eliminating the need for its removal. Further, associated top-surface silicon consumption may be reduced. The annealing may be any standard annealing process known in the art.

According to an embodiment of the invention, there may be a limit to the maximum width of an SOI island, as BOX cure oxidation occurs via diffusion from the edges. Oxidation conditions for an annealing process may be chosen to minimize edge-to-center differences across the island dimensions. Examples of such considerations include, but are not limited to, using wet oxidation and using relatively high temperatures (such as, higher than 1000° Celsius).

According to an embodiment of the invention, if the amount of BOX oxidation necessary for a high-quality SOI device exceeds that allowable for sidewall oxidation 60, then the sidewalls may be protected with a nitride spacer (not shown) applied after etching but before the oxidation. FIG. 5 illustrates the oxidation of the BOX layer combined with the oxidation of the sidewalls. It is understood that the SOI island width may be etched to a dimension greater than the desired final size in order to accommodate silicon consumption during sidewall oxidation. Defusing the oxygen from the sides may be an order of magnitude faster than diffusion through the first silicon layer 20, and can translate into savings in time and a much lower temperature process.

Figure 6:
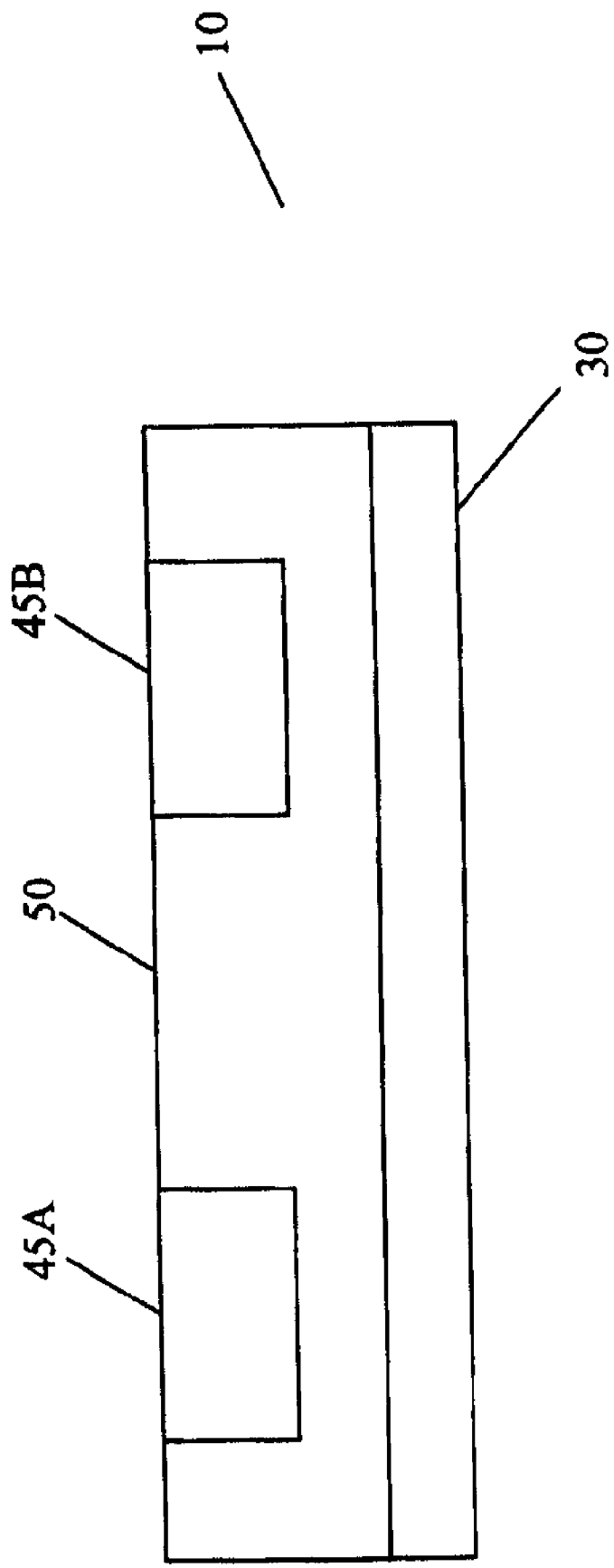
FIG. 6 is a cross-sectional view of an isolated substrate layer according to principles of the invention.

FIG. 6 is a cross-sectional view of an isolated substrate layer according to principles of the invention. The island structures 45A and 45B are isolated by filling the shallow trench 55 with an electrically isolating material 50, such as silicon dioxide.

While the invention has been described in terms of exemplary embodiments, those skilled in the art will recognize that the invention can be practiced with modifications and remain within the spirit and scope of the appended claims.

What is claimed is:

1. A method for forming a semiconductor structure comprising the steps of:
    implanting oxygen into a substrate to form a first layer and a second layer in the substrate;
    removing at least one portion of the first layer of the substrate to form a resulting substrate; and
    oxidizing the resulting substrate,
    wherein the first layer is a silicon-on-insulator layer,
    wherein the second layer is a buried oxide layer,
    wherein the step of removing the at least one portion of the first layer of the substrate further comprises:
        applying a mask to a surface of the first layer of the substrate; and
        etching the first layer of the substrate, and
    wherein the step of removing the at least one portion of the first layer of the substrate exposes the second layer of the substrate.

2. The method according to claim 1, further comprising the step of applying a pad material layer to the first layer of the substrate, wherein at least a portion of the pad layer is removed during the step of removing the at least one portion of the first layer, and the pad material layer is a material selected from the group consisting of oxide, nitride, or a combination of such materials.

3. The method according to claim 1, wherein the step of oxidizing the resulting substrate increases the thickness of the second layer of the substrate.

4. The method according to claim 1, further comprising the step of providing a material in the removed at least one portion of the first layer of the substrate.

5. The method according to claim 4, where the material is silicon dioxide.

6. The method of claim 1 where the sidewalls of the first layer exposed during removal of the at least one portion of the first layer are protected by silicon nitride spacers prior to oxidizing the resulting substrate.

7. A method for forming a semiconductor structure comprising the steps of:
    implanting oxygen into a substrate to form a first layer and a buried oxide layer in the substrate;
    applying a pad material layer to the first layer of the substrate;
    applying a mask to a surface of the pad material layer;
    etching the pad material layer and the first layer of the substrate, wherein the etching removes at least one portion of the pad material layer and the first layer of the substrate to form a resulting substrate; and
    oxidizing the resulting substrate to increases the thickness of the buried oxide layer,
    wherein the step of removing the at least one portion of the first layer of the substrate exposes the buried oxide layer of the substrate.

8. The method according to claim 7, wherein the step of oxidizing the resulting substrate simultaneously passivates the sidewalls of the first layer exposed by the etching.

9. The method according to claim 7, further comprising the step of providing silicon dioxide in the removed at least one portion of the buried oxide layer.

10. A semiconductor structure comprising:
   a first layer; and
   a second layer adjacent to the first layer, wherein at least one portion of the second layer is exposed through the first layer and exposes at least one sidewall of the first layer, and characterized in that the at least one sidewall includes an oxide layer,
   wherein the second layer is a buried oxide layer resulting from a high dose oxygen implantation, and
   wherein the exposed at least one sidewalls of the first layer is protected by silicon nitride spacers prior to oxidizing a resulting substrate.

11. The semiconductor structure according to claim 10, further comprising a material located adjacent the exposed portion of the second layer.

12. The semiconductor structure according to claim 11, wherein the material is silicon dioxide.

13. The semiconductor structure according to claim 11, wherein the material electrically isolates at least one portion of the first layer from at least one other portion of the first layer.

* * * * *